United States Patent [19]
Brightman et al.

[11] Patent Number: 5,417,012
[45] Date of Patent: May 23, 1995

[54] EQUIPMENT CABINET DOOR MOUNTABLE ON EITHER SIDE AND HAVING A CENTRAL LATCH

[75] Inventors: Timothy H. Brightman, Franklin; Kenneth Gulick, Lunenburg; Robert L. Hanson, Marlboro; Brian R. Herrick, Lunenburg; Edwin A. Jeffery, Natick, all of Mass.; Maria J. Kozo, Maryville, Tenn.; Carl A. Swanson, Clinton, Mass.

[73] Assignee: Digital Equipment Corporation, Maynard, Mass.

[21] Appl. No.: 156,160

[22] Filed: Nov. 23, 1993

[51] Int. Cl.⁶ .............................. E05D 7/02
[52] U.S. Cl. ...................... 49/382; 49/388; 49/394; 312/223.2; 312/329
[58] Field of Search ............ 49/382, 394, 388; 312/223.2, 329

[56] References Cited

U.S. PATENT DOCUMENTS

| | | | |
|---|---|---|---|
| 3,378,954 | 4/1968 | Sandin | 49/382 |
| 4,258,632 | 3/1981 | La Pointe | 49/382 X |
| 4,690,468 | 9/1987 | Lau | 49/382 X |
| 4,785,581 | 11/1988 | Abramson et al. | 49/388 X |

OTHER PUBLICATIONS

Drawings of early prototype publicly displayed more than one year prior to Nov. 23, 1993: Figure 1—overall cabinet Figure 2—front and rear bezels Figure 3—front and rear doors Figure 4—base/cap Figure 5—foot Primary Examiner—Philip C. Kannan
Attorney, Agent, or Firm—James F. Thompson; Ronald C. Hudgens

[57] ABSTRACT

An equipment cabinet employs a rack-mountable equipment enclosure surrounded by a base, a cap, and front and rear covers. Each cover consists of a bezel and a door reversibly mounted thereon via removable hinge pins. The bezels have sidewalls that rest against ledges on the edges of the enclosure to receive support therefrom. The door has a centrally-located latch, the latch having a pawl with an eccentric catch portion that engages a latch opening on a ledge extending from the bezel. The pawl also has a tab that rests between the ends of an arcuate raised portion on the rear of the door to limit the rotational travel of the pawl.

9 Claims, 12 Drawing Sheets

EQUIPMENT CABINET DOOR MOUNTABLE ON EITHER SIDE AND HAVING A CENTRAL LATCH

FIELD OF THE INVENTION

The invention is related to the field of electronic equipment packaging, and more particularly to equipment cabinets such as deskside cabinets for computer and related equipment.

BACKGROUND OF THE INVENTION

The art of electronic equipment packaging is challenged by the increasing functional density of the equipment to be enclosed. For example, magnetic disk data densities have increased so dramatically that a fundamental change in the industry is occurring: large-capacity storage units are more likely to contain an array of small, high-density disk drives rather than a single larger drive. Similar density advances are being made elsewhere in the electronics industry. Therefore an equipment cabinet occupying a given space must often accommodate multiple modular functional units rather than a single large unit.

Additionally, a single modular unit may be used in multiple products, ranging from a deskside product of relatively small capacity, to a larger rack-sized product supporting a whole organization. One major difference between such products is the type of cabinet in which they are housed. However, because the cabinets in these different products house the same modular unit, it is both possible and desirable to have interchangeability features so that costs associated with design, manufacturing, and inventory can be minimized.

Along with the above considerations, modern equipment cabinets should enhance modularity, which is the ability to move things around as needed, as well as expandability, which is the ability to add functional units for increased capacity. All these concerns must be addressed along with general requirements that equipment cabinets have—strength, stability, access to the enclosed equipment, cooling, power distribution, and esthetics.

SUMMARY OF THE INVENTION

It is an object of the present invention to minimize costs associated with multiple related products having quite different sizes and configurations. It is also an object of this invention to provide an equipment cabinet that accommodates modern high-density electronic components, and provides modularity and expandability. Finally, it is an object to provide such a cabinet while satisfying normal requirements of strength, stability, adequate access, cooling, and power distribution, and an aesthetically pleasing outer appearance.

In one aspect, the invention is an equipment cabinet having an enclosure for holding modular electronic assemblies, a base on which the enclosure rests, a cap resting on top of the enclosure, and front and rear covers attached to the base and the cap to cover the front and rear of the enclosure. The enclosure rests between ribs extending along inner portions of side walls of both the base and cap, so that hollow regions exist adjacent to both the top and bottom of the enclosure. The ribs provide strong vertical support, while the hollow regions can be used for such things as mounting auxiliary equipment or routing cables.

The enclosure has raised surfaces on its sides that terminate at front and rear edges configured to have a ledge parallel to the raised surface and an abutment surface. The front and rear covers each have side walls that rest against the ledges, thereby getting lateral support, and also abut the abutment surfaces of the raised surface. This configuration provides an aesthetically pleasing flush seam between the enclosure and the covers, while also providing mechanical stability to the sides of the covers.

In one embodiment of the present invention, both the base and cap have handle-like projections extending from the front and rear thereof to which the covers are attached. These projections also allow for the passage of cables from the top or bottom of the enclosure to its front or rear. The covers have inward-facing snap tabs that engage the handle-like projections of the base and cap to secure them thereto. Thus the cabinet consisting of the enclosure, base, cap, and covers can be assembled without additional securing hardware.

Another general feature of the present invention is the ability to arrange cabinets side-by-side in a banked configuration, thus contributing to the expandability which is an object of the present invention. Several specific features are shown. For example, the side walls of the covers have removable access panels that are flush therewith when installed. When the access panels are removed, access openings are exposed that can conveniently be used to route power- or information-carrying cables between cabinets.

Additional features contribute to the mechanical stability of such a banked configuration. For example, removable L-shaped feet upon which the cabinet rests may be attached with either an outward or inward orientation. In the outward orientation, these feet extend beyond the sides of the cabinet to reduce any tendency of the cabinet to tip; in the inward orientation, the feet are entirely beneath the cabinet so that they don't interfere with feet from an adjacent cabinet. In a preferred embodiment, each foot is the same part so that the parts count for the cabinet is reduced.

To further enhance mechanical stability, adjacent cabinets in a banked configuration may be secured together with clips extending through the above-described access openings. These clips engage corresponding features on the base and cap. A particular clip is described that forms another aspect of the present invention. The clip has a generally C-shaped body of resilient material, such as sheet metal, having a central portion and opposing end portions. The terminal region of each end portion is spaced apart from the terminal region of the other end portion to define an opening therebetween, and each end portion is configured to cooperate with a feature on the cabinet to retain the clip when installed thereon. In a preferred embodiment, this configuration is an inwardly-bent tip that grasps a tab on the cabinet. The body also has at least one spacing member extending from the central portion toward the opening, being dimensioned and positioned on the central portion to cooperate with the end portions to maintain a predetermined spaced-apart relationship between the cabinets. By thus relying on the clip for proper spacing, adjacent enclosures may advantageously be precisely spaced.

A further aspect of the present invention is a doorway formed on the front and rear covers of the cabinet that allows access to the front and rear of the enclosure. The doorway has a frame which in the described embodiment is a bezel surrounding either the front or rear of the enclosure. The frame has two parallel hinge ledges extending from opposite ends. A door is pivotally mounted on the hinge ledges at one side of the doorway opening, and the door and hinge ledges are also configured so that the door may also be mounted at the other side of the opening. One mounting method is shown that employs holes in the hinge ledges and in tabs located in the corners of the door, with removable hinge pins extending therethrough. This reversibility increases the accessibility of the electronic assemblies mounted in the enclosure.

A latch ledge also extends from the frame between the hinge ledges, the latch ledge having a latch opening centered between the sides of the doorway opening. The door has a latch midway between its sides that engages the latch opening; this central location enables the latch to work regardless of which direction the door pivots. A preferred latch called a pawl is shown, the pawl being generally circular and having a rearward-extending tab that rests in a recess between the ends of an arcuate raised portion of the door surrounding the hole in which the pawl is mounted. The pawl has an eccentric catch portion that engages the latch opening, and also has a shoulder portion that gently urges against the bottom of the latch ledge when the latch is open. This configuration reduces any tendency of the door to rattle, and lends a solid feeling to the cabinet.

BRIEF DESCRIPTION OF THE DRAWINGS

An embodiment of the invention will be described with reference to the accompanying drawings, in which.

DETAILED DESCRIPTION

Figure 1:
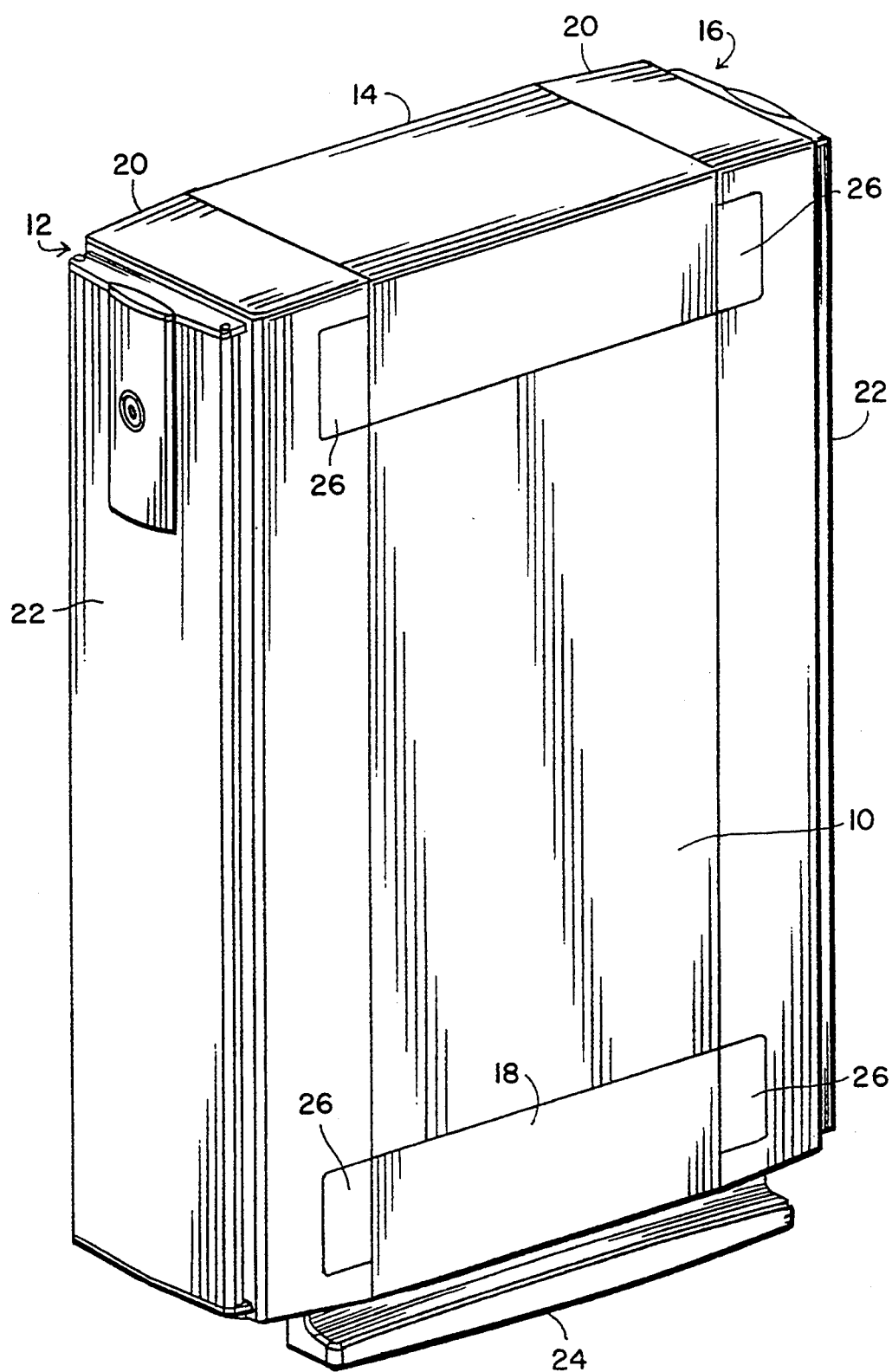
FIG. 1 is a perspective view of an assembled equipment cabinet embodying the principles of the present invention.

FIG. 1 shows an equipment cabinet having an inner enclosure 10 surrounded by a front cover 12, cap 14, rear cover 16, and base 18. Both the front cover 12 and rear cover 16 consist of a bezel 20 with an attached door 22. The base 18 rests on a pair of reversible elongated feet 24.

As will be seen, cabinets like that of FIG. 1 can easily be arranged in banks for expansion purposes. To effect inter-cabinet cabling and attachment in such banks, there are holes in the sides of the bezels 20 that form inter-cabinet passageways when two cabinets are arranged side by side. In FIG. 1 these holes are covered by removable access panels 26. The access panels 26 remain in place to cover the holes on exterior surfaces of either a stand-alone cabinet or a bank of cabinets, and may be removed from internal surfaces of a bank of cabinets to create the abovementioned inter-cabinet passageways.

Figure 2:
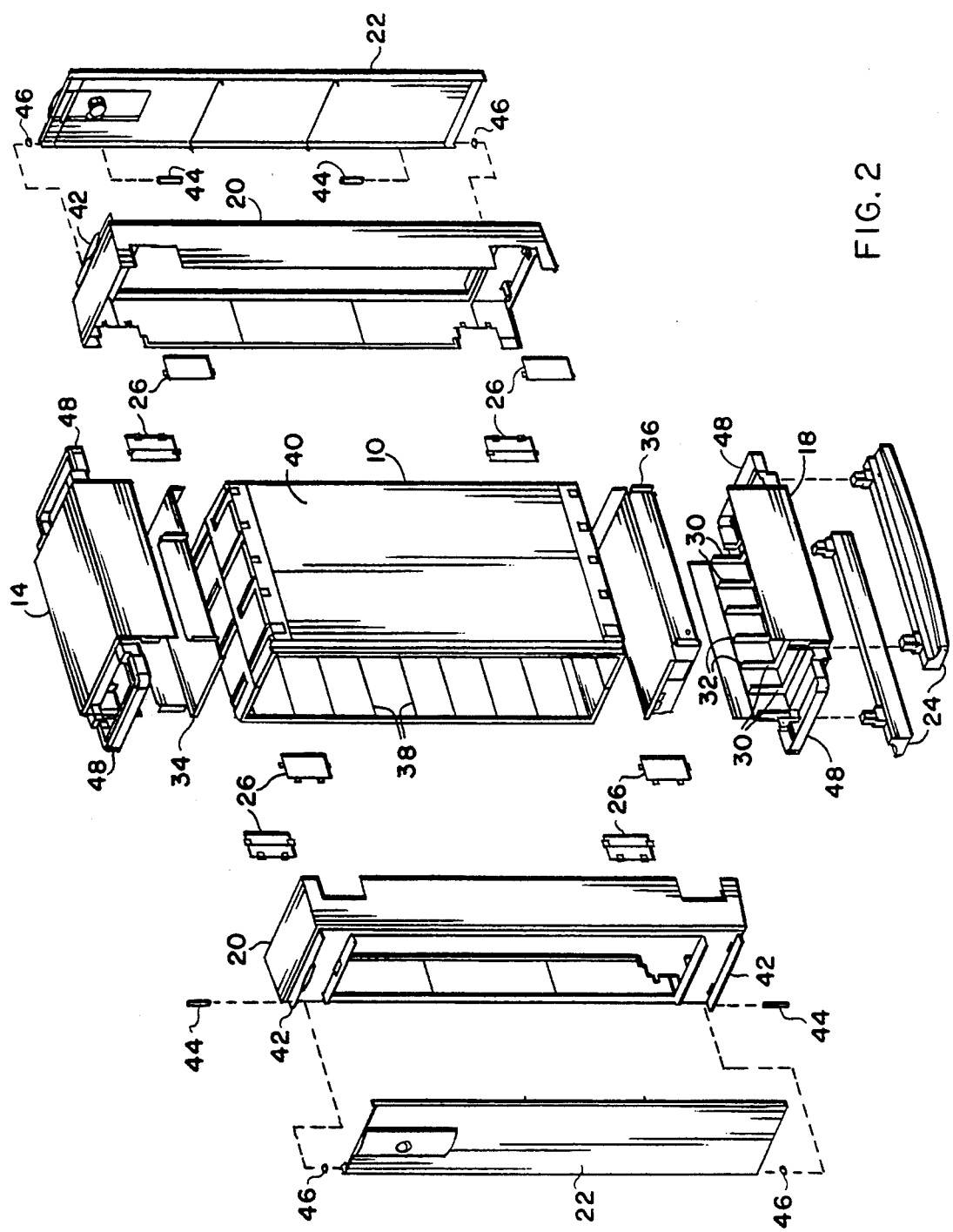
FIG. 2 is an exploded perspective view of the equipment cabinet of FIG. 1.

FIG. 2 shows an exploded view of the cabinet of FIG. 1. It will be noted that the base 18 and cap 14 are identical in construction, except for foot attachment features that are shown in more detail in FIG. 3 below. Both the base 18 and cap 14 contain hollow areas surrounded on three sides by support ribs 30. The enclosure 10 rests on the shoulders 32 of the ribs 30; similar rib shoulders within the cap 14 support the cap 14 on the enclosure 10. This configuration creates hollows between the enclosure 10 and both the base 18 and cap 14 when the cabinet is assembled. A metal mounting bracket 34 resides within the hollow of the cap 14, and an AC power distribution module 36 having an outer portion identical to the mounting bracket 34 rests within the hollow of the base 18.

The enclosure 10 is a two-piece six-sided box of the type commonly referred to as a "clamshell". The enclosure 10 is suitable for slidably mounting multiple disk drives or other electronic assemblies along guide grooves 38 formed on the inner surfaces of the enclosure 10. The assemblies so mounted may conveniently mate with a printed circuit board at the interior rear of the enclosure 10, not shown in FIG. 2, to effect inter-assembly connections.

The enclosure 10 is designed so that it may be mounted horizontally in a standard 19" equipment rack, as well as vertically in the cabinet of FIGS. 1 and 2. To this end, each side of the enclosure 10 has a raised surface portion 40 that has an aesthetically pleasing finish that matches the exterior finish of the other cabinet components, such as the base 18, the cap 14, and the bezels 20. The front and rear edges of the surface portion 40 abut corresponding edges of the bezels 20 so that the enclosure 10 is held firmly in place when the cabinet is assembled.

Each door 22 is mounted on a pair of hinge ledges 42 extending from the face of the corresponding bezel 20. Metal hinge pins 44 at both the top and bottom extend through corresponding holes in the door 22 and the hinge ledges 42. A rubber washer 46 is used between the door 22 and each hinge ledge 42 to maintain spacing.

The shape of the bezels 20 and their interface to the enclosure 10 create additional hollows at the front and rear of the cabinet. These hollows can be used for such things as cabling and cooling fans. The bezels 20 are sufficiently long to extend beyond the hollows of the base 18 and cap 14, so that the enclosure is completely surrounded by a continuous peripheral passageway formed of all the hollows. It will also be noted that the bottoms of the bezels 20 are open to allow cable access to the front and rear of the enclosure 10 from the bottom of the cabinet. Both the base 18 and cap 14 have handle-like lateral projections 48 that maintain these bottom openings. Since the bezels 20 extend down to the bottom of the base 18, the feet 24 help make the bottom openings in the bezels 20 accessible by raising the unit off of the floor.

Figure 3:
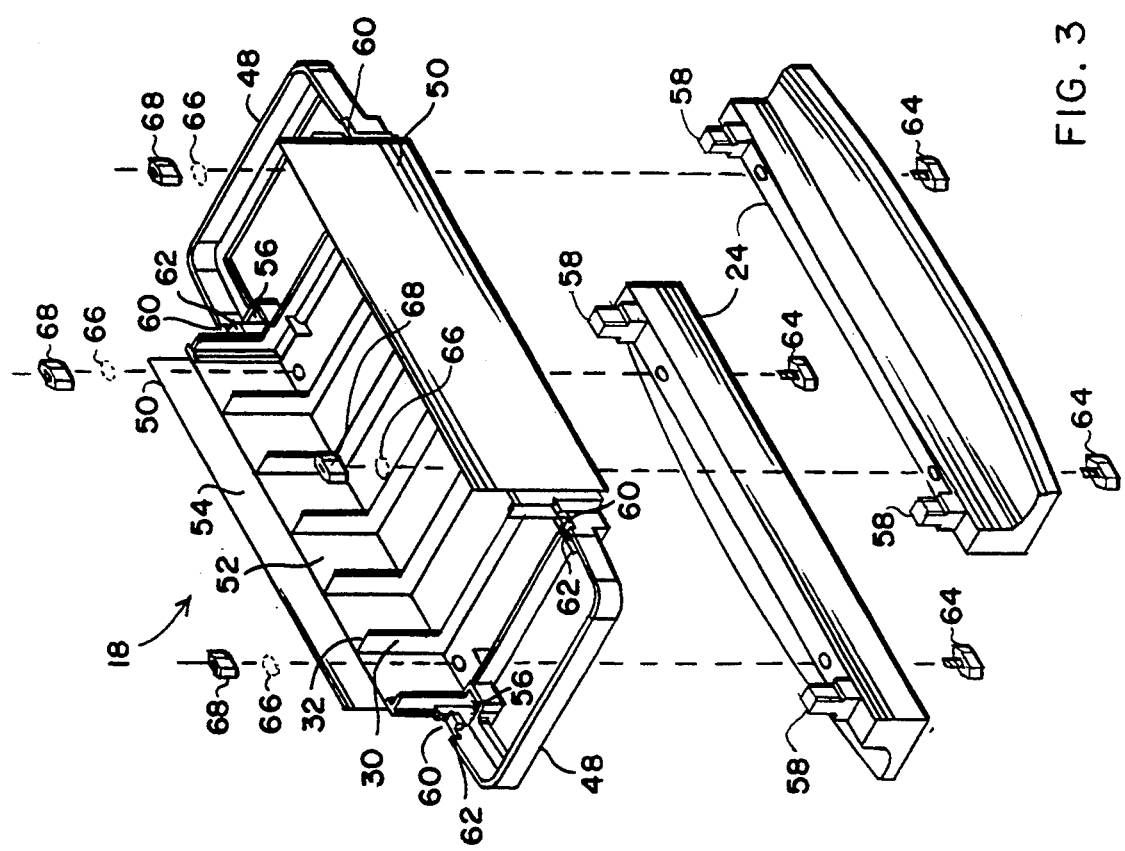
FIG. 3 is a perspective view of a base with attached feet that is part of the equipment cabinet of FIG. 2.
Figure 4:
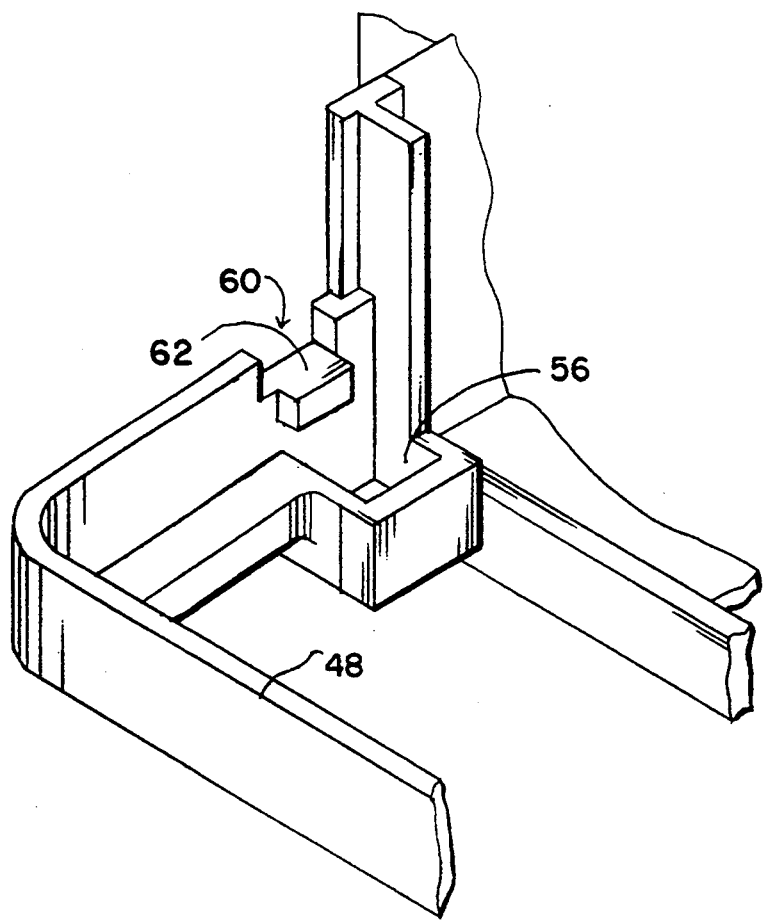
FIG. 4 is a perspective view of a portion of the base of FIG. 3.

FIG. 3 shows both the base 18 and the attachment of the feet 24 in greater detail. The base 18 has a pair of upstanding opposing side walls 50 divided into a lower portion 52 and an upper portion 54. The ribs 30 extend along the side walls 50 only along the lower portion 52, and terminate at shoulders 32 that are normal to the side walls 50. Extending from the front and rear are the handle-like projections 48 having an L-shaped cross section. Where the projections 48 meet the side walls 50, there are receptacles 56 for receiving the posts 58 of the feet 24. Also, a small notch 60 is formed, and a small interior tab 62 adjacent to the notch 60; this arrangement is also shown in greater detail in FIG. 4. The notch 60 and tab 62 receive a clip that is used to secure adjacent cabinets together in a banked configuration. This clipping scheme is described in greater detail with reference to FIGS. 13 and 14 below.

Also shown in FIG. 3 are bolts 64 extending through holes in the feet 24 and the base 18. The feet 24 are hollow molded polycarbonate members open at their bottoms, so that the heads of the bolts 64 are recessed within the bottom of the feet 24 when installed therethrough. The bolts 64, along with washers 66 and nuts 68, are used to securely attach the feet 24 to the base 18. Alternative embodiments may of course use other known securing means. It may also be advantageous to dispense with separate securing means if the post 58 is formed to securely engage the receptacles 56, for example via a compression arrangement or by employing additional interlocking features thereon.

The feet 24 are removably attached to the base 18 in either the outward orientation shown in FIG. 3, or in an inward or "pigeon-toed" orientation. The outward orientation reduces the tendency of the cabinet to tip sideways when it is standing alone, while the inward orientation allows cabinets to be banked close together without interference between feet 24 from adjacent cabinets. It should be noted the feet 24 shown in FIG. 3 are identical in construction, thus reducing the number of different parts making up the cabinet. However, such identity is not required.

Figure 5:
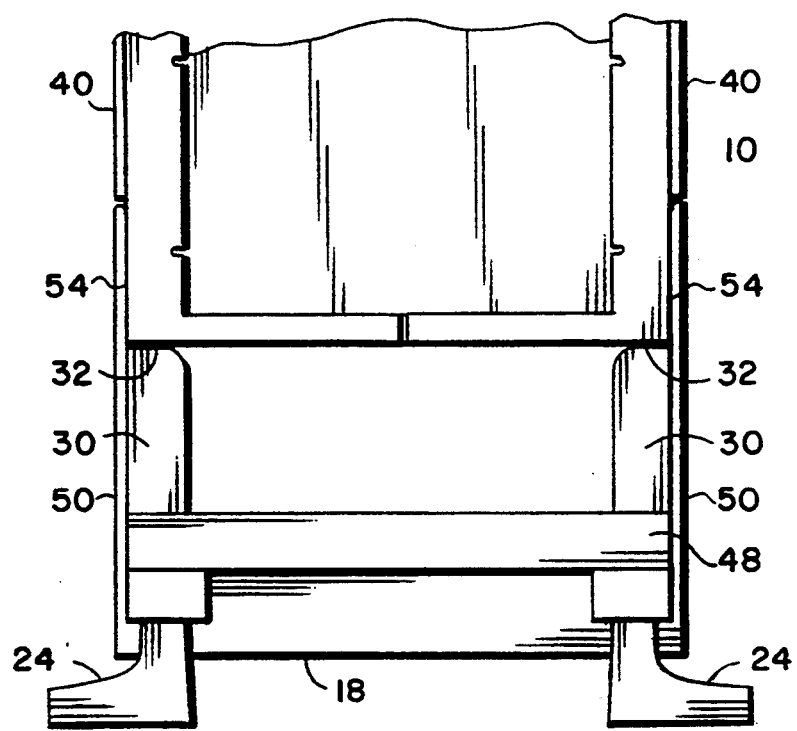
FIG. 5 is a front elevation view of the equipment cabinet of FIGS. 1 and 2 with the front cover removed.

FIG. 5 shows a side view of the enclosure 10 resting on the base 18. As already noted, the bottom of the enclosure 10 rests on the shoulders 32 of the ribs 30. The sides of the enclosure are slightly notched so that the raised surface portions 40 are flush with the side walls 50 of the base 18, and the notched portion rests between the upper portions 54 of the side walls 50. Alternative embodiments may advantageously dispense with the notches, in which case the sides of the enclosure 10 will rest inside the side walls 50 rather than being flush therewith as shown.

Figure 6:
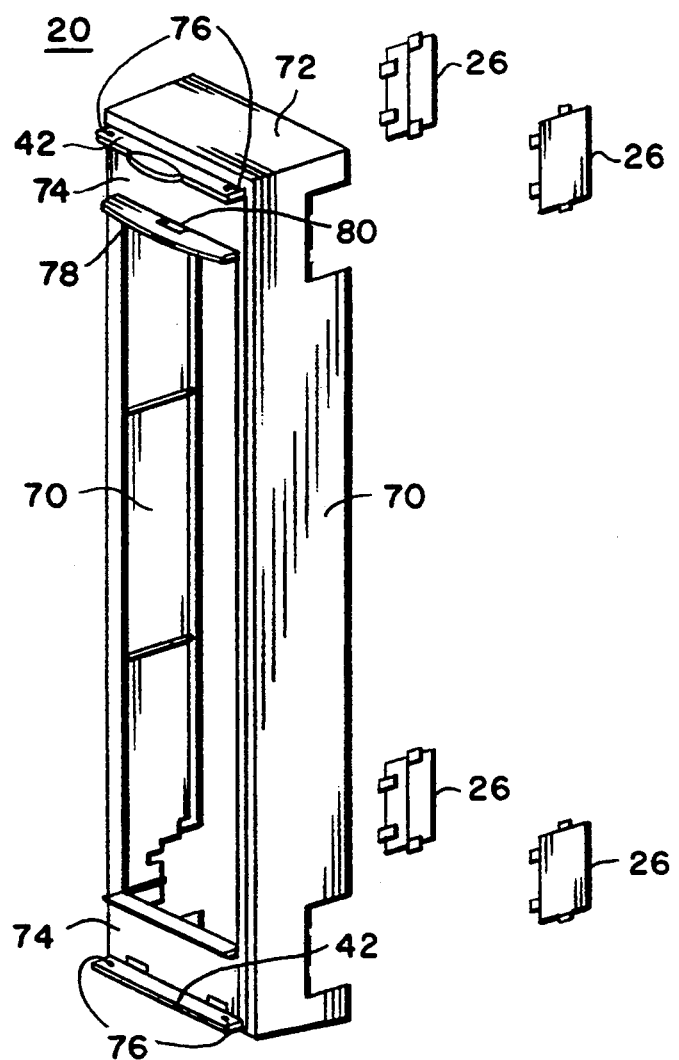
FIG. 6 is a perspective view of a bezel that is part of the equipment cabinet of FIGS. 1 and 2.
Figure 7:
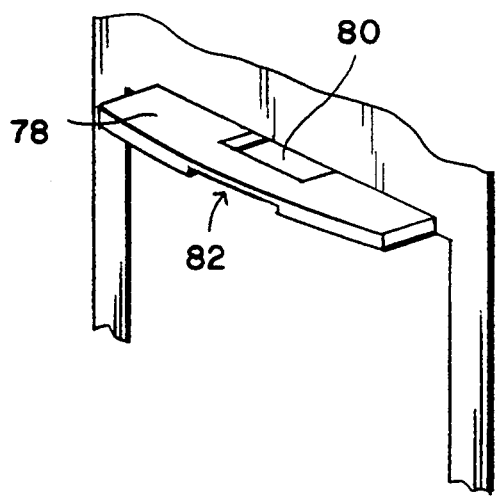
FIG. 7 is a perspective view of a portion of the bezel of FIG. 6.

FIGS. 6 and 7 show the bezel 20 in greater detail. The bezel 20 has side walls 70 joined by a top wall 72 and upper and lower bridging portions 74. As already mentioned, a pair of hinge ledges 42 extend outward from the bridging portions 74 to hold the door 22 of FIGS. 1 and 2. Each hinge ledge 42 has two holes 76 disposed on opposite sides thereof, so that the door 22 may be mounted on either side of the bezel 20. A latch ledge 78 also extends from the upper bridging portion 74 between the hinge ledges 42. The latch ledge 78 has a centrally-located opening 80 to receive a latch located in center of the door 22; this latch is described in greater detail in FIGS. 10-12 below. The latch ledge 78 also has a bevelled lower front edge portion 82 that gently urges against the door latch to ease its passage when the door 22 is closed. The central location of the latch makes it effective to latch the door 22 regardless of which side it is mounted on, without requiring any rearrangement of the latch or its duplication of on both sides of the door.

Figure 8:
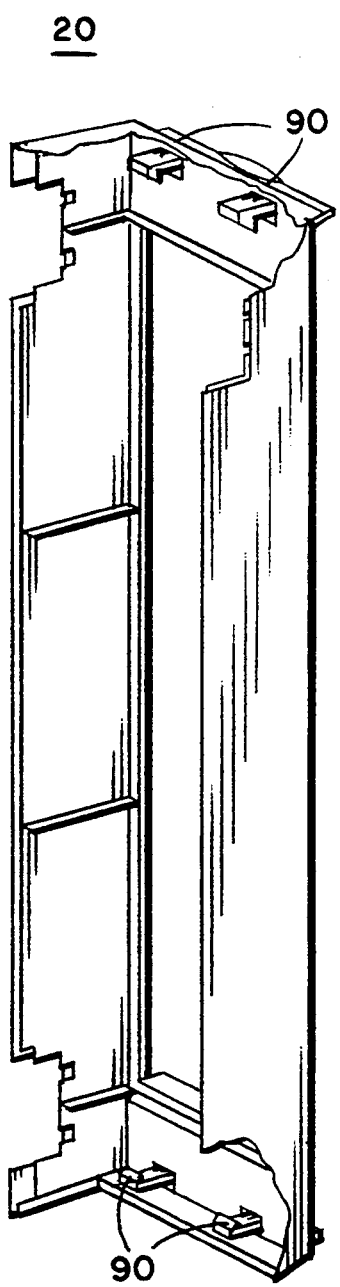
FIG. 8 is a perspective view of the inside of the bezel of FIG. 6 with top and bottom portions cut away.

FIG. 8 shows the bezel 20 with top and bottom portions cut away to reveal molded inward-facing snap tabs 90 used to attach the bezel 20 to the base 18 and the cap 14. The snap tabs 90 near the top of the bezel 20 face downward, while those near the bottom face upward. The snap tabs 90 may be configured with ribbed portions along their backs, not shown in FIG. 8, to both stiffen the tabs and to spread deflection forces over a greater area, namely the face of the vezel 20. The end portion of the snap tabs catch the handle-like projections 48 of the base 18 and cap 14 when the bezel 20 is placed in position at the front or rear of the cabinet. Once the bezel 20 is so installed, it is removed by depressing the snap tabs 90 away from the handle-like projections 48. This can be accomplished by reaching through the central opening of the bezel 20 and using a pair of fingers to exert the necessary force.

Figure 9:
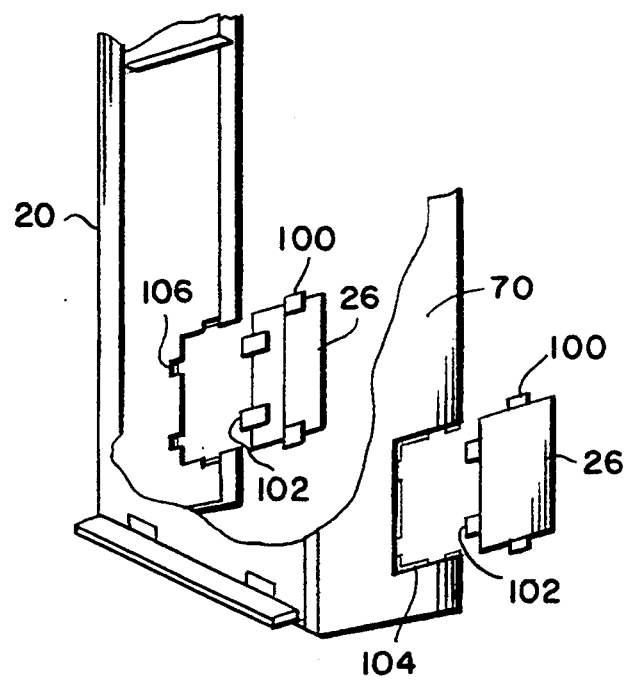
FIG. 9 is a cutaway view of the lower portion of the bezel of FIG. 6.

FIG. 9 shows how the access panels 26 attach to the bezel 20. Each panel 26 has a generally flat body whose shape conforms to a cutaway portion of the side wall 70 of the bezel 20. The panel 26 has side tabs 100 and end tabs 102 formed on its inner surface. The side wall 70 is formed to have ledge portions 104 that extend into the cutaway, and notches 106 to receive the end tabs 102. When installed, the lower part of the panel 26 rests against the ledge portions 104, the side tabs 100 rest against the inside surface of the side wall 70, and the end tabs 102 also rest against the side wall 70 in the notches 106 to hold the panel firmly in place. It should be noted that the tabs 100 and 102, like the snap tabs 90 of FIG. 8, may also be configured with ribbed portions for greater strength and improved frictional fit.

Figure 10:
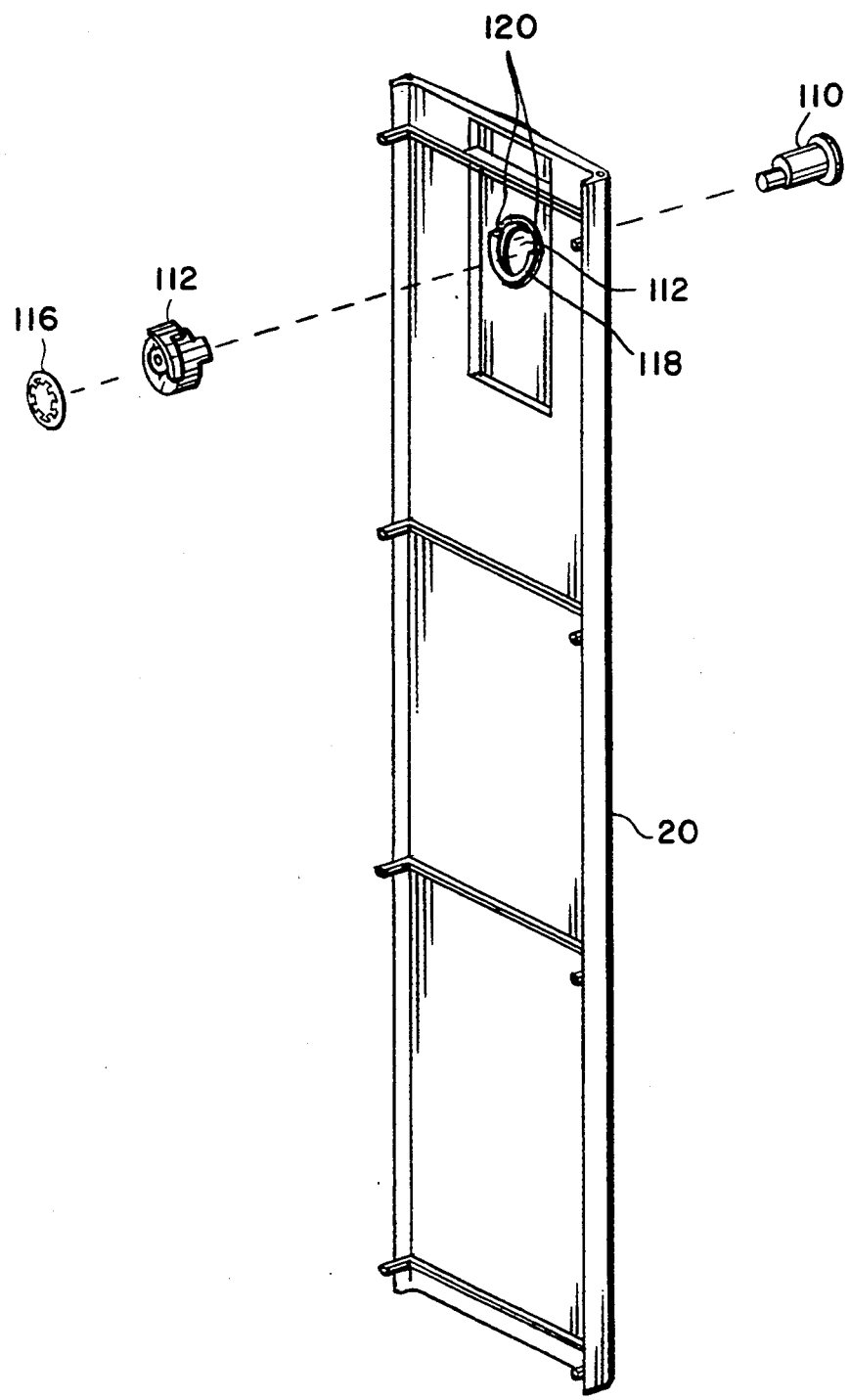
FIG. 10 is an exploded perspective view of a door that is part of the equipment cabinet of FIGS. 1 and 2.

FIG. 10 shows the latching mechanism of the door 20 in greater detail. A tumbler 110 extends through an opening 112 on the upper part of the door 20. A pawl 114 is placed over the rear part of the tumbler 110, and a retaining clip 116 holds the mechanism together. The door 20 has a raised portion 118 on the rear thereof partially surrounding the opening 112, leaving a space between the ends 120 of the raised portion 118.

While the latching mechanism shown in FIG. 10 employs a key-receiving tumbler 110, it is clear that other types of barrel-shaped members may be employed instead. For example, it may be advantageous to use a non-locking member having any of a variety of protruding handles, such as a knob, a lever, or a key-like handle.

Figure 11:
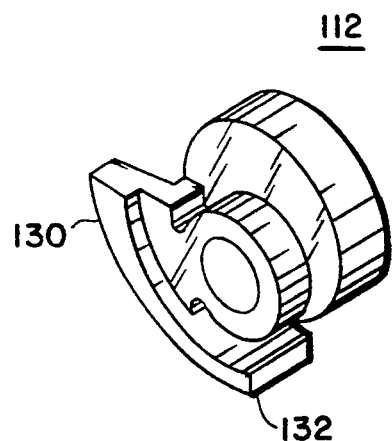
FIG. 11 is a perspective view of a pawl that is part of the latching mechanism of the door of FIG. 10.
Figure 12:
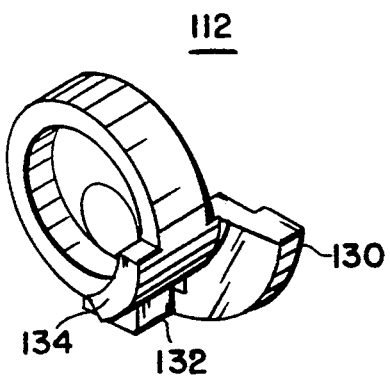
FIG. 12 is another perspective view of the pawl of FIG. 11.

FIGS. 11 and 12 show the pawl 112 in greater detail. It has a generally circular shape, and has an eccentric catch portion 130 that engages the opening 80 in the latch ledge 78 of the bezel 20 when the door 20 is locked. The pawl 112 also has a shoulder portion 132 at one end of the catch portion 130 and a tab 134. The shoulder portion 132 urges gently against the lower surface of the latch ledge 78 when the door 20 is closed and unlocked. The tab 134 sits within the space between the ends 120 of the raised portion 118 of the door 20 to limit the rotational travel of the latch mechanism. Referring back to FIG. 10, the rotational position of the pawl 112 shown therein is the unlocked position. In this position, the tab 134 is at its clockwise limit as viewed from the rear of the door 20. The locked position is 90° counter-clockwise from the position shown. In that position, the tab 134 is at its counter-clockwise limit, and the catch portion 130 is sticking straight up.

Figure 13:
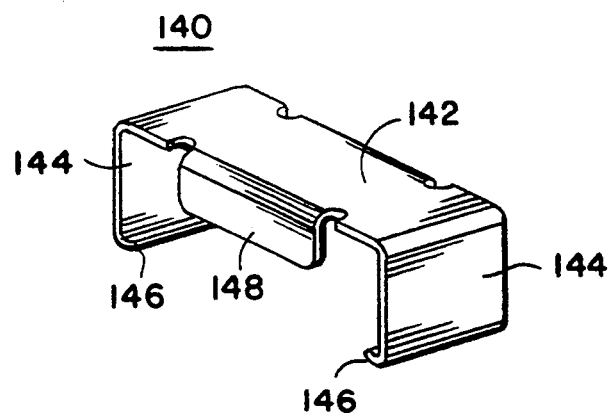
FIG. 13 is a perspective view of a clip that is used to hold the equipment cabinet of FIGS. 1 and 2 to a similar equipment cabinet when configured in a bank.
Figure 14:
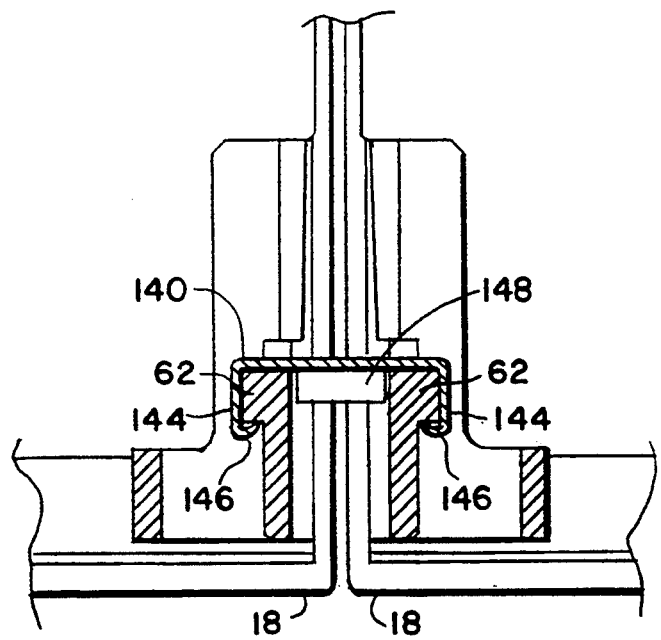
FIG. 14 is an elevation view showing the installation of the clip of FIG. 13 on an adjacent pair of bases each like the base of FIG. 3.

FIG. 13 shows a perspective view of a clip 140 that is used to hold adjacent cabinets together in a bank of cabinets. The clip 140 is stamped from 16-mil thick sheet metal, and bent to have the illustrated shape. It has a generally C-shaped body with a central portion 142, opposing end portions 144, and catch portions 146. Spacing members 148 extend from each side of the central portion 142. FIG. 14 is a partial view of a pair of bases 18 arranged side by side, this arrangement corresponding to a banked configuration of the cabinet of FIGS. 1 and 2. For clarity, the remaining components of the cabinets, such as the enclosure 10, bezels 20, and cap 1, are not shown in FIG. 14. It is to be understood that the cabinet bases 18 and caps 14 are clipped together, each in two places, in the preferred embodiment.

In FIG. 14, the central portion 142 of the clip 140 rests within the notches 60. The spacing members 148 extend downward between the handle-like projections 48, while the end portions 144 and catch portions 146 engage the tabs 62. The spacing members 148 and end portions 144 therefore cooperate to maintain a predetermined spacing between the side walls 50 of the bases 18, while the catch portions 146 act both to retain the clip 140 and to arrest any relative vertical displacement of the bases 18. In this fashion, the clip 140 securely attaches adjacent cabinets together when they are arranged in a bank.

While the illustrated clip 140 is formed of stamped sheet metal, it may be formed otherwise in alternative embodiments. It way be advantageous to use a different resilient material, such as a stiff polymer. It may also be made in ways other than by stamping and bending, for example by casting or brazing, or by injection-molding in the case of a polymer. In such embodiments the clip 140 must be sufficiently strong and resilient to hold the objects retained thereby, and the end portions 144, spacer members 148, and catch portions 146 must be configured to cooperate with mating features on the retained objects to maintain them in the desired spaced-apart relationship.

What has been described herein is an equipment cabinet having several new and advantageous features. While these features have been described in the context of a single cabinet, it is clear that they have other independent uses. For example, the combination of the base 18 and reversible feet 24 may be viewed as a stand that could be used to support equipment with or without the covers 12, 16 and cap 14. Similarly, the reversible doorway formed by the bezel 20 and door 22 could be used with other cabinet configurations. For example, the door frame might be an integral part of a unitary cabinet rather than a removable bezel. The clip 140 may likewise be used to secure many types of objects other than equipment cabinets together.

Additionally, the features as described herein are susceptible to modification in manners apparent to those skilled in the art. It is therefore intended that the invention encompass all embodiments thereof within the scope of the following claims.

What is claimed is:
1. A doorway, comprising:
   a frame defining a doorway opening;
   two spaced-apart hinge ledges extending from said frame at opposite ends of said doorway opening being generally parallel to each other and aligned in the direction normal thereto;
   a door for closing said doorway opening, said door being pivotally mounted at one side thereof on said hinge ledges along a first axis extending normally therebetween at one side of said doorway opening, said door and said hinge ledges being cooperatively configured for pivotally mounting said door at the other side thereof along a second axis extending normally between said hinge ledges at the opposite side of said doorway opening;
   a latch ledge extending from said frame between said hinge ledges, said latch ledge being generally parallel to said hinge ledges and aligned therewith and having a latch opening therethrough substantially centered between said first and second axes; and
   a latch on said door substantially centered between the sides thereof and located opposite said latch ledge to engage said latch opening when said door is closed thereby latching said door.
2. A doorway according to claim 1, wherein said latch ledge is immediately adjacent to said doorway opening.
3. A doorway according to claim 1, wherein each of said hinge ledges has two holes, each hole being aligned with a corresponding one of said first and second axes, and wherein said door has a tab in each corner thereof, each tab having a hole therethrough being aligned with a corresponding one of said axes, and further comprising:
   two removable hinge pins aligned with said first axis, each hinge pin extending through a corresponding one of said tabs and a corresponding one of said hinge ledges.
4. A doorway according to claim 3, further comprising two rubber washers each disposed between a corresponding one of said tabs and a corresponding one of said hinge ledges and having a corresponding one of said hinge pins extending therethrough.
5. A doorway according to claim 1, wherein said frame is a bezel configured to be mounted at the front of an equipment enclosure to allow access thereto.
6. A doorway according to claim 1, wherein said latch comprises a lock mechanism.
7. A doorway according to claim 6, wherein said door has a hole in which said latch is mounted, said hole being partially surrounded by an arcuate raised portion on the inside surface of said door, said raised portion terminating at angularly-separated ends, and wherein said latch comprises:
   a tumbler disposed in said hole and having a barrel-shaped portion extending rearward of said door;
   a pawl mounted on said barrel-shaped portion of said tumbler, said pawl being generally circular and having a tab extending therefrom toward the rear surface of said door, said pawl resting against said raised portion of said door such that said tab is disposed in the space between the angularly-separated ends of said arcuate raised portion, said pawl also having an eccentric catch portion configured to engage said latch opening when said pawl is in a locked rotational position wherein said tab rests against one end of said arcuate raised portion, said pawl also having a shoulder portion located to gently urge against the bottom surface of said latch ledge when said pawl is in an unlocked rotational position wherein said tab rests against the other end of said arcuate raised portion.

8. A doorway according to claim 7, wherein said latch ledge has a bevelled front edge to gently deflect said shoulder portion of said pawl as said door is closed with said pawl in said unlocked position.

9. A doorway, comprising:

a frame defining a doorway opening;

two spaced-apart hinge ledges extending from said frame at opposite ends of said doorway opening being generally parallel to each other and aligned in the direction normal thereto, each of said hinge ledges having two spaced-apart holes each aligned with a corresponding one of two spaced-apart axes extending between said hinge ledges at opposite sides of said doorway;

a door for closing said doorway opening, said door having a tab in each corner, each tab having a hole therethrough being aligned with a corresponding one of said axes, said door also having a hole therein substantially centered between the sides thereof, said hole being partially surrounded by an arcuate raised portion on the inside surface of said door, said raised portion terminating at angularly-separated ends;

two removable hinge pins for pivotally mounting said door on said hinge ledges, said hinge pins aligned with one of said axes, and each hinge pin extending through a corresponding one of said tabs and a corresponding one of said hinge ledges;

two rubber washers each disposed between a corresponding one of said tabs and a corresponding one of said hinge ledges and having a corresponding one of said hinge pins extending therethrough;

a latch ledge extending from said frame between said hinge ledges, said latch ledge being generally parallel to said hinge ledges and aligned therewith and having a latch opening therethrough, said latch ledge being configured and located such that said latch opening is directly opposite said hole in said door;

a tumbler disposed in said hole of said door and having a barrel-shaped portion extending rearward thereof; and a pawl mounted on said barrel-shaped portion of said tumbler, said pawl being generally circular and having a tab extending therefrom toward the rear surface of said door, said pawl resting against said raised portion of said door such that said tab is disposed in the space between the angularly-separated ends of said arcuate raised portion, said pawl also having an eccentric catch portion configured to engage said latch opening when said pawl is in a locked rotational position wherein said tab rests against one end of said arcuate raised portion, said pawl also having a shoulder portion located to gently urge against the bottom surface of said latch ledge when said pawl is in an unlocked rotational position wherein said tab rests against the other end of said arcuate raised portion.

* * * * *